United States Patent
Takano et al.

(10) Patent No.: US 9,525,299 B2
(45) Date of Patent: *Dec. 20, 2016

(54) CHARGING DEVICE FOR STORAGE BATTERY, AND CHARGING METHOD FOR STORAGE BATTERY

(71) Applicant: NISSAN MOTOR CO., LTD., Yokohama-shi, Kanagawa (JP)

(72) Inventors: Atsushi Takano, Sagamihara (JP); Tsutomu Soga, Machida (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 179 days.

This patent is subject to a terminal disclaimer.

(21) Appl. No.: 14/384,030

(22) PCT Filed: Mar. 8, 2013

(86) PCT No.: PCT/JP2013/056464
§ 371 (c)(1),
(2) Date: Sep. 9, 2014

(87) PCT Pub. No.: WO2013/137142
PCT Pub. Date: Sep. 19, 2013

(65) Prior Publication Data
US 2015/0054449 A1 Feb. 26, 2015

(30) Foreign Application Priority Data
Mar. 13, 2012 (JP) .................................. 2012-056291

(51) Int. Cl.
*H02J 7/00* (2006.01)
*H01M 10/44* (2006.01)
*G01R 31/36* (2006.01)

(52) U.S. Cl.
CPC ............ *H02J 7/007* (2013.01); *G01R 31/3606* (2013.01); *H01M 10/443* (2013.01);
(Continued)

(58) Field of Classification Search
CPC ........ H02J 7/007; H02J 7/0077; H02J 7/0091; H02J 7/0093; H01M 10/443; G01R 31/3606
(Continued)

(56) References Cited

U.S. PATENT DOCUMENTS 5,563,493 A * 10/1996 Matsuda ................. G06F 1/263
320/124
6,097,176 A 8/2000 Yao et al.
(Continued)

FOREIGN PATENT DOCUMENTS

CN 100382408 C 4/2008
CN 101834324 A 9/2010
(Continued)

OTHER PUBLICATIONS

Machine translation of JP2007-143214, 6 pages.*
(Continued)

*Primary Examiner* — Nathaniel Pelton
(74) *Attorney, Agent, or Firm* — Foley & Lardner LLP

(57) ABSTRACT

A charging device for a storage battery includes: a charging power source for supplying electric power to a storage battery; a charging electric power detecting device adapted to detect electric power charged to the storage battery; a full charge determining device adapted to make a full charge determination based on a detected value of the charging electric power detecting device; and a charging controlling device adapted to conduct charging control by charging the storage battery until the full charge determination is made, stopping charging when the full charge determination is
(Continued)

made, restarting charging after a prescribed time period elapses from the stop of charging, and continuing charging until the full charge determination is made again. The charging device further includes a temperature detecting device adapted to detect a temperature of the storage battery; and a stop time setting device adapted to set a stop time based on at least the temperature of the storage battery at the full charge determination. The stop time setting device sets the stop time to be longer as the detected temperature of the temperature detecting device becomes lower.

6 Claims, 7 Drawing Sheets

(52) U.S. Cl.
 CPC .......... *H02J 7/0077* (2013.01); *H02J 7/0091* (2013.01); *H02J 7/0093* (2013.01)
(58) Field of Classification Search
 USPC .................................................. 320/107, 153
 See application file for complete search history.

(56) References Cited

U.S. PATENT DOCUMENTS

| | | | | |
|---|---|---|---|---|
| 6,937,947 | B2 * | 8/2005 | Trembley | H02J 7/0091 320/107 |
| 7,906,934 | B2 | 3/2011 | Inoue et al. | |
| 2005/0237024 | A1 | 10/2005 | Hogari et al. | |
| 2008/0272653 | A1 | 11/2008 | Inoue et al. | |
| 2010/0176768 | A1 * | 7/2010 | Kimura | H01M 10/443 320/152 |
| 2012/0112703 | A1 * | 5/2012 | Xu | H02J 7/0022 320/145 |
| 2015/0054449 | A1 | 2/2015 | Takano et al. | |
| 2015/0236541 | A1 | 8/2015 | Takano et al. | |

FOREIGN PATENT DOCUMENTS

| | | | |
|---|---|---|---|
| JP | 05-083876 | A | 2/1993 |
| JP | 07-312230 | A | 11/1995 |
| JP | 10-145979 | A | 5/1998 |
| JP | 2000-150000 | A | 5/2000 |
| JP | 2002-303658 | A | 10/2002 |
| JP | 2003-143770 | A | 5/2003 |
| JP | 2003-324857 | A | 11/2003 |
| JP | 2005-124340 | A | 5/2005 |
| JP | 2005-312239 | A | 11/2005 |
| JP | 2006-288002 | A | 10/2006 |
| JP | 2007-143214 | * | 6/2007 |
| JP | 2007-143214 | A | 6/2007 |

OTHER PUBLICATIONS

USPTO Office Action, U.S. Appl. No. 14/422,523, Mar. 16, 2016, 39 pages.

USPTO Office Action, U.S. Appl. No. 14/422,523, Jul. 28, 2016, 29 pages.

* cited by examiner

FIG. 7

| NUMBER OF TIMES OF FULL CHARGE DETERMINATION | 1 | 2 | 3 | 4 | 5 |
|---|---|---|---|---|---|
| CORRECTION COEFFICIENT | 1 | 0.8 | 0.6 | 0.4 | 0.4 |

CHARGING DEVICE FOR STORAGE BATTERY, AND CHARGING METHOD FOR STORAGE BATTERY

TECHNICAL FIELD

The present invention relates to charging control for a storage battery.

BACKGROUND ART

As a charging device for charging a storage battery, a charging device configured to stop charging when a fully-charged state is detected after the start of charging and conduct recharging after elapse of a prescribed time period set in advance has been known (for example, JP 2005-124340 A). As in the device, stopping charging for a prescribed time period after detection of an apparent fully-charged state and recharging allows an actual charge state of a battery to be closer to a fully-charged state.

SUMMARY OF INVENTION

However, a configuration involving setting in advance a time period to stop charging (hereinafter referred to as charging stop time) after detection of a fully-charged state, as in the charging device disclosed in JP 2005-124340 A, has a difficulty in setting an appropriate charging stop time. When the charging stop time is too short, the actual charge state of a storage battery cannot be sufficiently made close to the fully-charged state. On the other hand, when the charging stop time is too long, the time period from the start of charging to the end of recharging becomes unnecessarily longer.

Thus, it is an object of the present invention to set an appropriate charging stop time and thereby charge a storage battery efficiently.

According to one aspect of the present invention, there is provided a charging device for a storage battery, the charging device including: a charging power source for supplying electric power to a storage battery; charging electric power detecting means for detecting electric power charged from the charging power source to the storage battery; and full charge determining means for making a full charge determination when chargeable electric power calculated based on a detected value of the charging electric power detecting means drops to a prescribed electric power value set in advance or less. The charging device for a storage battery further includes charging controlling means for conducting charging by supplying electric power to the storage battery from the charging power source until the full charge determination is made, stopping electric power supply to the storage battery from the charging power source when the full charge determination is made, restarting charging after a prescribed time period elapses from the stop of electric power supply, and conducting charging until the full charge determination is made again. Then, the charging device for a storage battery further includes: temperature detecting means for detecting a temperature of the storage battery; and stop time setting means for setting a stop time based on at least the temperature of the storage battery at the full charge determination. The stop time setting means sets the stop time to be longer as the temperature of the storage battery becomes lower.

Hereinafter, embodiments and advantages of the present invention are described in detail with reference to the attached drawings.

BRIEF DESCRIPTION OF DRAWINGS

FIG. 7 is a table of correction coefficients for correcting a charging stop time.

DESCRIPTION OF EMBODIMENTS

First Embodiment

Figure 1:
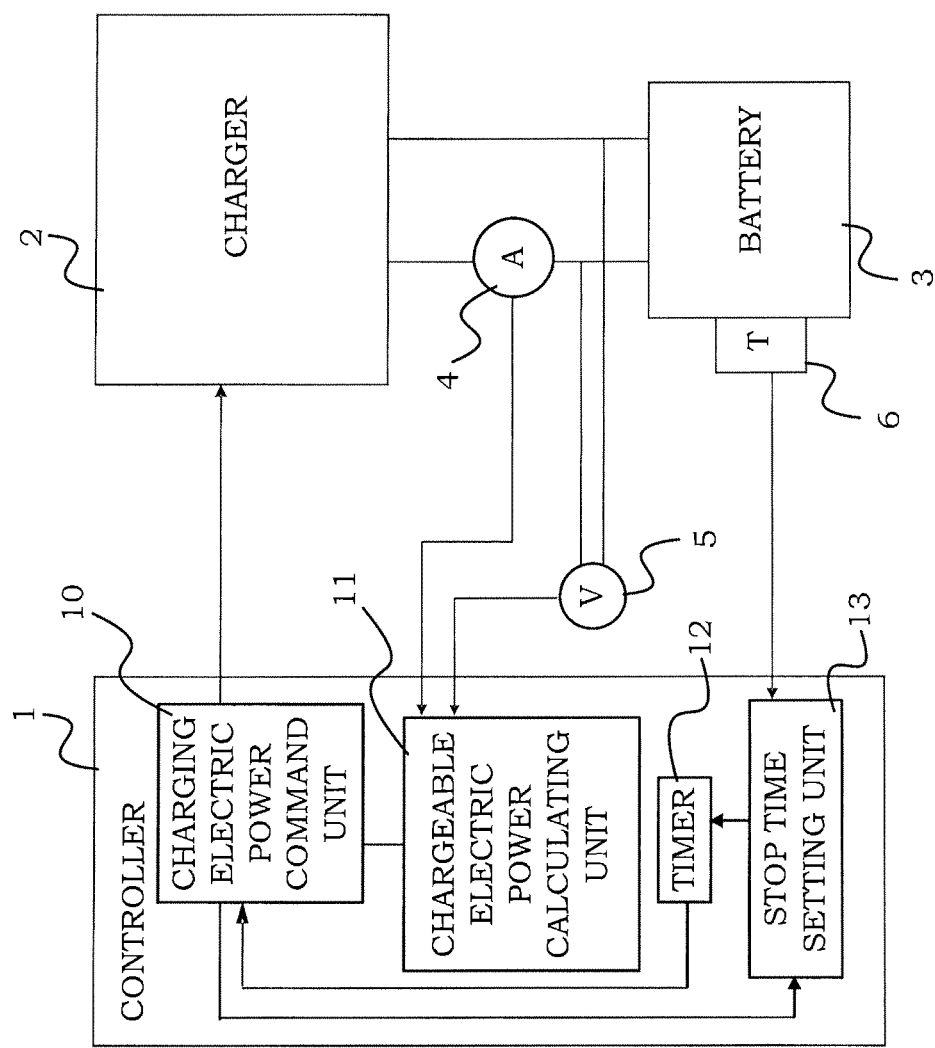
FIG. 1 is a configuration diagram of a charging system of an embodiment of the present invention.

FIG. 1 is a configuration diagram of a charging system according to an embodiment of the present invention.

The charging system includes a battery 3, a charger 2 for supplying charging electric power to the battery 3, and a controller 1 for controlling the charger 2. The charging system further includes a current sensor 4 for detecting a charging current supplied from the charger 2 to the battery 3, a voltage sensor 5 for detecting a voltage of the battery 3, and a temperature sensor 6 for detecting a temperature of the battery 3.

The controller 1 calculates electric power charged from the charger 2 to the battery 3 based on detected values of the current sensor 4 and the voltage sensor 5 and sends, to the charger 2, a charging electric power command based on the calculated charging electric power. Moreover, the controller 1 also reads a detected value of the temperature sensor 6. The internal configuration of the controller 1 is described later.

The charger 2 supplies, to the battery 3, charging electric power based on the charging electric power command sent from the controller 1.

The battery 3 is, for example, a storage battery such as a lithium-ion battery that is used as a power source for driving a drive motor of an electric-powered car. The battery 3 is charged by the charging electric power supplied from the charger 2.

The detected values of the current sensor 4, the voltage sensor 5, and the temperature sensor 6 are read by the controller 1.

Next, the internal configuration of the controller 1 is described. It should be noted that computation contents in constituent units are described with reference to the flow chart of FIG. 2.

The controller 1 includes a chargeable electric power calculating unit 11, a charging electric power command unit 10, a timer 12, and a stop time setting unit 13.

The chargeable electric power calculating unit 11 reads the detected values of the current sensor 4 and the voltage sensor 5, and calculates chargeable electric power based on the detected values. The chargeable electric power means electric power that can be charged to the battery 3 before the battery 3 reaches the fully-charged state.

The charging electric power command unit 10 sends, to the charger 2, a charging electric power command based on the chargeable electric power calculated by the chargeable electric power calculating unit 11. When the chargeable electric power calculated by the chargeable electric power calculating unit 11 drops to a prescribed electric power value set in advance or less, the charging electric power command unit 10 determines that the battery is in the fully-charged state and stops charging, specifically sets the charging electric power command to zero (kW). When the determination of the fully-charged state is made, the charging electric power command unit 10 sends a command for setting a charging stop time (hereinafter referred to as stop time setting command) to the stop time setting unit 13. After sending the stop time setting command, the charging electric power command unit 10 reads a count value of the timer 12 described later, and at the time point when the count value becomes zero, restarts sending, to the charger 2, a charging electric power command based on the chargeable electric power, to conduct so-called additional charging.

After receiving the stop time setting command sent from the charging electric power command unit 10, the stop time setting unit 13 calculates a stop time depending on the temperature of the battery and sets the calculated stop time on the timer 12. It should be noted that, while the details are described later, the stop time depending on the temperature of the battery is a time period set to be longer for a lower temperature of the battery.

After the stop time is set by the stop time setting unit 13, the timer 12 starts countdown (a process of decreasing the count value every prescribed time period). It should be noted that the minimum value of the count value is zero.

Figure 2:
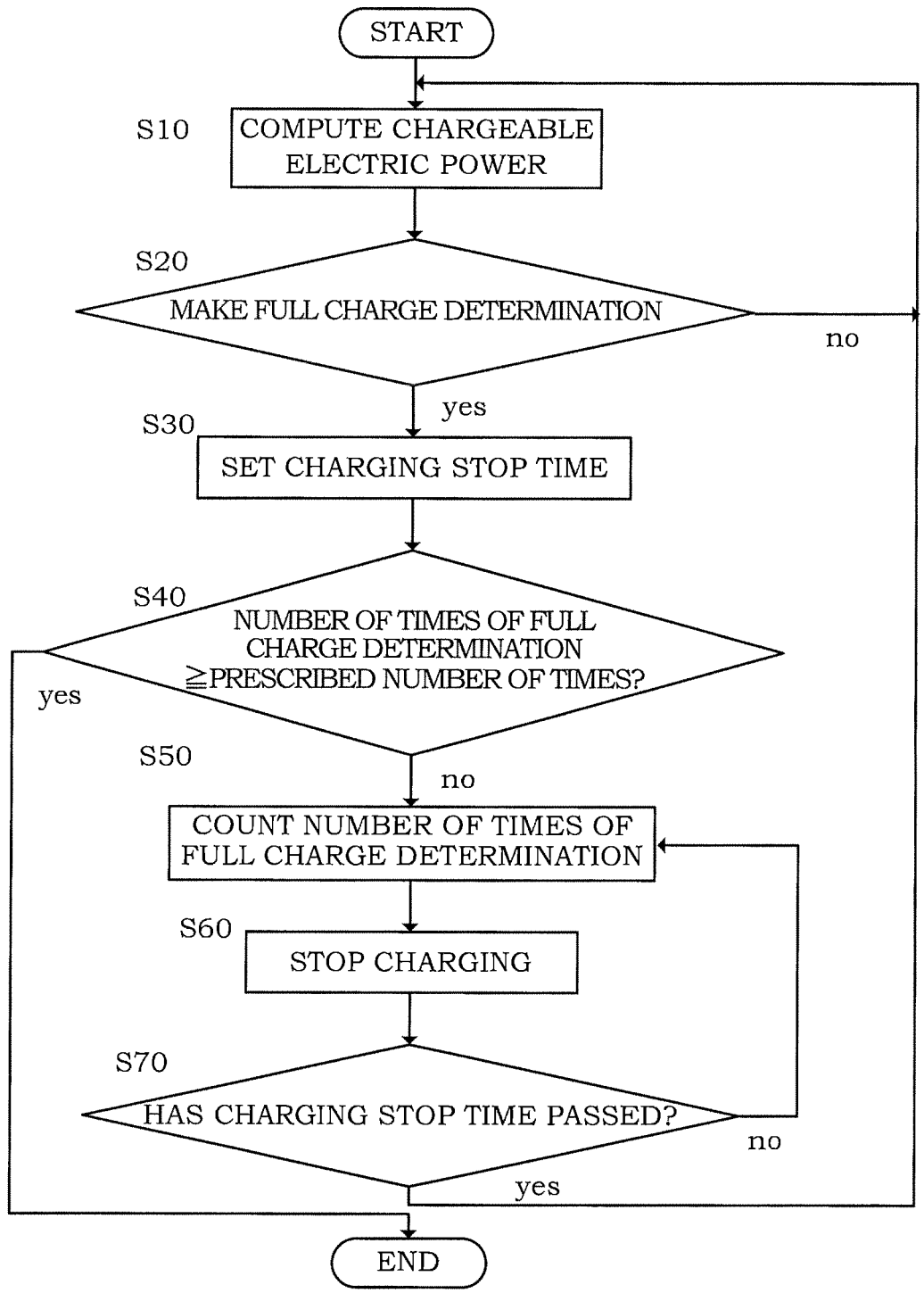
FIG. 2 is a flow chart of a charging control routine according to a first embodiment of the present invention.

FIG. 2 is a flow chart of a charging control routine executed by the controller 1.

In Step S10, the controller 1 computes the chargeable electric power. More particularly, the chargeable electric power calculating unit 11 computes the chargeable electric power based on the detected values of the current sensor 4 and the voltage sensor 5, this chargeable electric power is sent to the charging electric power command unit 10, and the charging electric power command unit 10 sends the charging electric power command to the charger 2.

Now, an example of a computation method for the chargeable electric power is described. First, a deviation between a full charge voltage set in advance and the detected value of the voltage sensor 5, specifically an increment of voltage ΔV to the fully-charged state is calculated. Next, an increment of current ΔI to the fully-charged state is calculated by using the increment of voltage ΔV and a resistance R of the battery 3 measured in advance. Then, an increment of electric power to the fully-charged state, specifically the chargeable electric power, can be calculated by using the increment of voltage ΔV and the increment of current ΔI.

In Step S20, the controller 1 determines whether the battery 3 is in the fully-charged state or not by the charging electric power command unit 10. Specifically, when the chargeable electric power drops to a prescribed electric power value set in advance or less, the controller 1 makes a determination of the fully-charged state (this determination is hereinafter referred to as "full charge determination"). Although the prescribed electric power value can be set to zero (kW) considering the purpose of the determination in this step, the chargeable electric power may not decrease to zero in case of a detection error of the respective sensors 4 and 5, or the like, which may result in failure in making the determination of the fully-charged state. Therefore, a value of almost near zero (kW) is set, by which the determination of the fully-charged state can be made even with a detection error of the respective sensors 4 and 5.

As a result of the determination, when the full charge determination is made, a process of Step S30 is executed, and when the full charge determination is not made, the process of Step S10 is executed again.

It should be noted that the full charge determination is just a determination that the chargeable electric power drops to a prescribed electric power value or less and is not a determination that the battery 3 actually reaches the fully-charged state.

Figure 3:
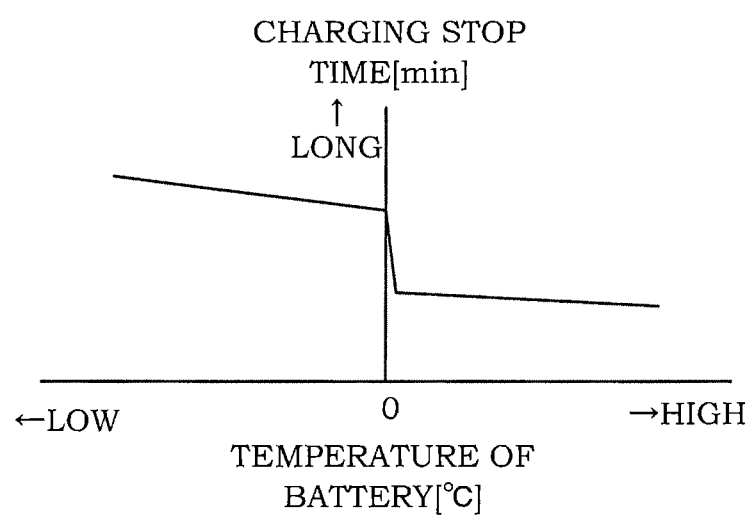
FIG. 3 is a map of a stop time.

In Step S30, the controller 1 sets the charging stop time after the full charge determination by the stop time setting unit 13. The stop time setting unit 13 reads the detected value of the temperature sensor 6, determines the stop time with reference to a stop time map stored in advance, sets the determined set time on the timer 12, and allows the timer 12 to start countdown. On the stop time map, a longer stop time is set for a lower temperature of the battery, as shown in FIG. 3, for example. This is based on characteristics that the time period until polarization is eliminated becomes longer as the battery temperature becomes lower. For example, in the case of a lithium-ion battery, polarization results from a difference in concentration caused by diffusion of a lithium-ion which is a diffusion material, and as the battery temperature becomes lower, it takes longer time to eliminate the difference in concentration due to a higher viscosity of an electrolyte. Therefore, setting a longer charging stop time for a lower temperature of the battery sufficiently eliminates polarization until restart of the charging.

It should be noted that the stop time map is not limited to that shown in FIG. 3 as long as the condition that a longer stop time is set for a lower temperature of the battery is satisfied. For example, a temperature region may be divided into a plurality of sections and the stop time may be set for every section.

In Step S40, the controller 1 determines whether or not the number of times of the full charge determination reaches a prescribed number of times set in advance or higher with reference to a value of a counter for counting the number of times of the full charge determination installed in the charging electric power command unit 10. The prescribed number of times can be set arbitrarily, but for example, set to about 5 times. When the value of the counter is below the prescribed number of times, a process of Step S50 is executed, and when the value of the counter is equal to or higher than the prescribed number of times, the value of the counter is reset to zero and charging is completed.

In Step S50, the controller 1 increments the value of the counter for counting the number of times of the full charge determination. The counter for counting the number of times of the full charge determination increments its value every full charge determination in Step S20 until the value of the counter is determined to be equal to or higher than the prescribed number of times in Step S40.

In Step S60, the controller 1 sends, to the charger 2, a charging electric power command of zero (kW) by the charging electric power command unit 10, to stop charging.

In Step S70, the controller 1 determines whether the charging stop time passes or not by the charging electric power command unit 10. Specifically, whether the count value of the timer 12 becomes zero or not is determined. When the charging stop time passes, the process of Step S10 is executed again for additional charging, and when the charging stop time does not pass, the process of Step S60 is executed again.

As described above, setting the stop time to be longer as the temperature of the battery at the full charge determination becomes lower and repeating additional charging until the number of times of the full charge determination reaches the prescribed number of times allows the charge state of the battery 3 to be closer to the true fully-charged state.

Figure 4:
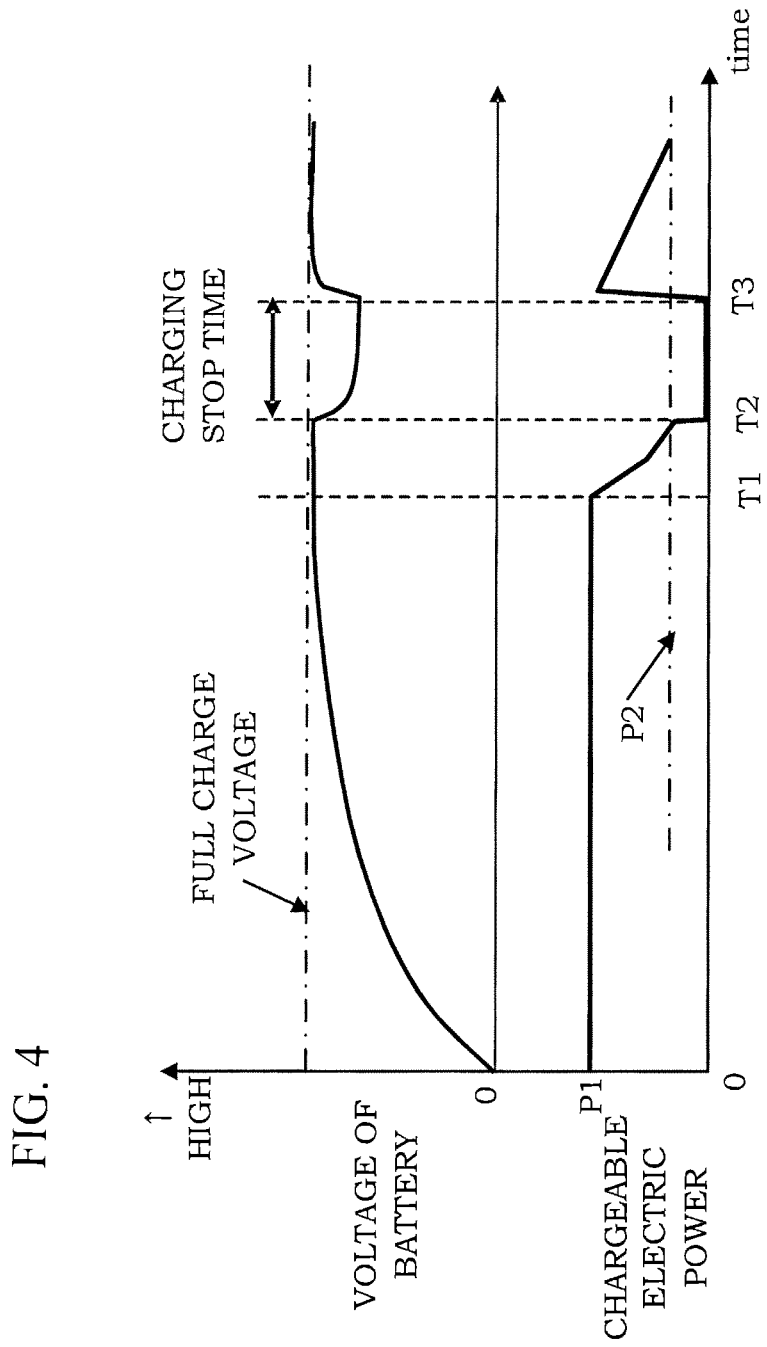
FIG. 4 is a time chart in the case of executing charging control.

FIG. 4 is a time chart in the case of executing the charging control described above.

When charging is started, the voltage of the battery gradually rises. It should be noted that the chargeable electric power stays at a constant value until the timing T1. This is because the chargeable electric power is limited to P1 which is an upper limit of a supply capacity of the charger 2, though larger chargeable electric power is calculated on the computation.

From the timing T1 at which the voltage of the battery comes closer to a full charge voltage, the chargeable electric power starts dropping. At the timing T2 at which the chargeable electric power drops to P2 or less which is a prescribed value set for determination on whether the battery is in the fully-charged state or not, the full charge determination is made and charging is stopped once. Then, from the timing T3 after elapse of the charging stop time, additional charging is started. After that, stopping and restarting of charging is similarly repeated until the number of times of the full charge determination reaches the prescribed number of times or higher.

Figure 5:
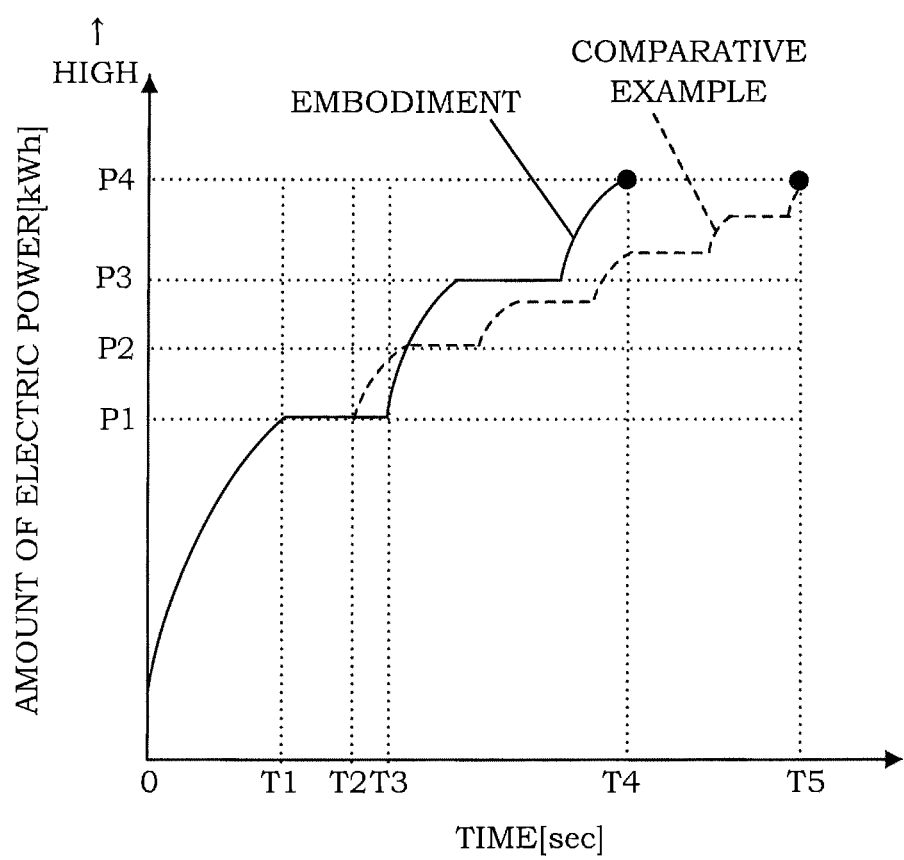
FIG. 5 is a time chart illustrating an effect according to the first embodiment of the present invention.

FIG. 5 is a time chart of the amount of electric power charged to the battery 3. The solid line in FIG. 5 represents a case of executing the charging control of this embodiment. As a comparative example, the broken line represents a case of employing a constant charging stop time regardless of the temperature of the battery. It should be noted that the temperature of the battery is, for example, around zero (° C.).

From the start of charging to the timing T1 at which the first full charge determination is made, the amount of electric power increases similarly in this embodiment and the comparative example, and charging is stopped. While charging is restarted at the timing T3 in this embodiment involving setting the charging stop time depending on the temperature of the battery, in the comparative example of employing a constant charging stop time regardless of the temperature of the battery, additional charging is started at the timing T2 which is earlier than the timing T3.

Comparison of the amount of electric power at the second full charge determination reveals that, while the amount of electric power increases to P3 in this embodiment, the amount of electric power increases only to P2 which is lower than P3 in the comparative example. This is because the charging stop time enabling sufficient elimination of polarization is set depending on the temperature of the battery in this embodiment, but in the comparative example, charging is restarted in the state in which polarization is eliminated insufficiently because the charging stop time is constant regardless of the temperature of the battery. After the second full charge determination, the similar tendency continues.

As a result, the amount of electric power reaches P4 which is the amount of electric power at the true fully-charged state at the timing T4 in this embodiment, but reaches at the timing T5 which is later than the timing T4 in the comparative example. As described above, in the charging control involving stopping charging once after the full charge determination and conducting additional charging after elapse of the charging stop time, setting a longer charging stop time for a lower temperature of the battery enables efficient charging of a storage battery.

The effects of the first embodiment described above are summarized as follows.

The temperature sensor 6 for detecting the temperature of the battery 3 and the stop time setting unit 13 for setting a charging stop time based on at least the temperature of the battery at a full charge determination are provided, by which the charging stop time is set to be longer for a lower temperature of the battery. This enables efficient charging because the charging stop time becomes longer for a circumstance requiring a longer time to eliminate polarization due to a low temperature of the battery, which results in an increased amount of electric power charged by means of additional charging.

Because charging is finished when the number of times of the full charge determination reaches a prescribed number of times set in advance, additional charging is not repeated unnecessarily.

Second Embodiment

A charging system of a second embodiment of the present invention is similar to the first embodiment in that charging is stopped after the full charge determination and additional charging is conducted after elapse of the charging stop time set based on the temperature of the battery, but differs from the first embodiment in that the charging stop time is corrected based on the number of times of the full charge determination.

Figure 6:
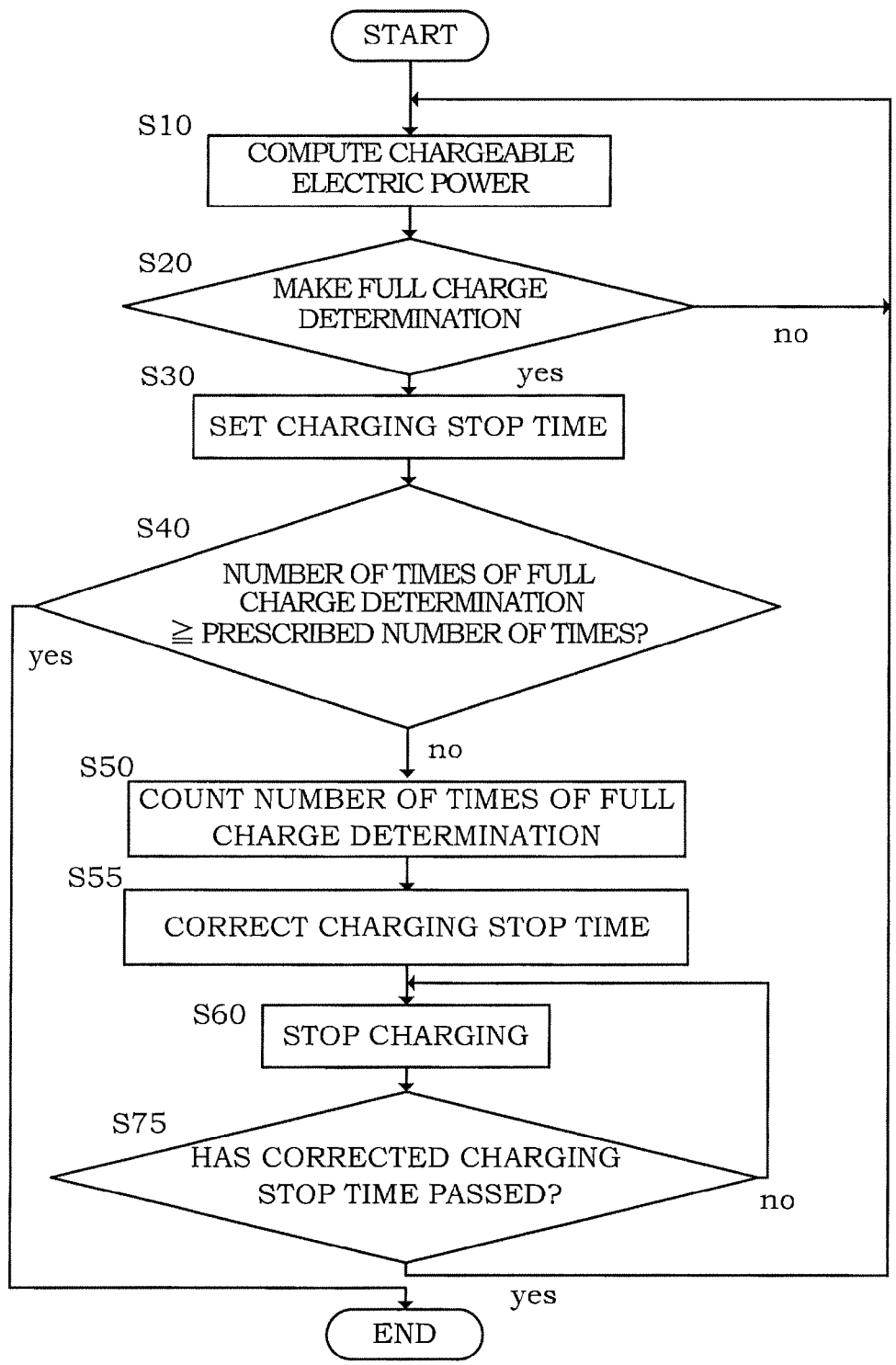
FIG. 6 is a flow chart of a charging control routine according to a second embodiment of the present invention.

FIG. 6 is a flow chart illustrating an example of a charging control routine conducted by the controller 1 in the second embodiment. Differences from the flow chart of FIG. 2 are that, after counting the number of times of the full charge determination in Step S50, Step S55 of correcting the charging stop time depending on the number of times of the full charge determination is executed and that it is determined in Step S75 whether the corrected charging stop time has passed or not. Hereinafter, the differences are described.

In Step S55, the controller 1 corrects the charging stop time set in Step S30 to be shorter as the number of times of the full charge determination becomes higher. Specifically, the charging stop time set in Step S30 in the same manner as in the first embodiment is multiplied by a correction coefficient α which is equal to or less than 1 and becomes smaller as the number of times of the full charge determination becomes higher. The correction coefficient α is determined based on the value of the counter for counting the number of times of the full charge determination, for example, with reference to a table obtained in advance by an experiment or the like as shown in FIG. 7.

In additional charging, the voltage of the battery is close to the full charge voltage and therefore the charging current becomes small as compared to that before the full charge determination, which results in a less difference in concentration of a diffusion material caused by polarization. Specifically, the voltage of the battery hardly drops while the charging is stopped after the full charge determination. Therefore, as the number of times of the full charge determination becomes higher, the influence of polarization becomes smaller and the charging stop time to wait for elimination of polarization can be shortened. Then, the charging stop time set depending on the temperature of the battery is multiplied by the correction coefficient α which is a value of 1 or less and becomes smaller as the number of times of the full charge becomes higher, to set the charging stop time to be shorter as the number of times of the full charge determination becomes higher and thereby prevent setting of an unnecessarily longer charging stop time. This enables setting of a more appropriate charging stop time as compared to the first embodiment and can prevent the charging time from being unnecessarily longer.

It should be noted that the relation between the number of times of the full charge determination and the correction coefficient α shown in the table of FIG. 7 is set based on the result of an experiment or the like in which the degree of polarization eliminated after the charging is stopped is examined. In FIG. 7, when the number of times of the full charge determination is 4 times or more, the correction coefficient α is fixed to a certain value without change. By this, the charging stop time does not become extremely short when the number of times of the full charge determination becomes high, and additional charging itself can be conducted.

Step S75 is the same as Step S70 in that a determination on whether the charging stop time passes or not is made based on whether the count value of the timer 12 becomes zero or not. It should be noted that the count value at the start of countdown differs.

As described above, the second embodiment involves correcting the charging stop time to be shorter as the number of times of the full charge determination becomes higher, and thereby enables charging of a storage battery more efficiently as compared to the first embodiment.

Moreover, after the number of times of the full charge determination reaches a prescribed number of times, the charging stop time at the time point when the number of times of the full charge determination reaches the prescribed number of times is maintained. Hence, the charging stop time is not unnecessarily shortened and additional charging can be conducted.

It should be noted that the charging method and the full charge determination method are not limited to those described in the above embodiments. Instead of the charging electric power command output by the charging electric power command unit 10, a charging current command based on the chargeable electric power calculated by the chargeable electric power calculating unit 11 may be output. For example, there may be employed a configuration in which the charging electric power command unit 10 sends, as a charging current command, a value obtained by dividing the chargeable electric power calculated by the chargeable electric power calculating unit 11 by the voltage of the battery.

Further, instead of the charging electric power command output by the charging electric power command unit 10, a charging voltage command based on the chargeable electric power calculated by the chargeable electric power calculating unit 11 may be output. For example, there may be employed a configuration in which the chargeable electric power calculating unit 11 calculates chargeable electric power based on a prescribed full charge voltage set in advance and the voltage of the battery, and a constant full charge voltage set in advance is sent as a charging voltage command until the chargeable electric power drops to a prescribed value or less. In this case, at the time point when the chargeable electric power calculated by the chargeable electric power calculating unit drops to the prescribed value or less, the determination of the fully-charged state may be made and the charging command may be set to zero (kW). It should be noted that the chargeable electric power calculating unit 11 may make the determination of the fully-charged state when the voltage of the battery reaches the prescribed full charge voltage set in advance or when a deviation between the voltage of the battery and the prescribed full charge voltage set in advance becomes a prescribed value or less.

As described above, the charging system of the present invention only needs to employ a configuration involving charging until the battery 3 reaches the fully-charged state and stopping charging for a prescribed time period after the battery 3 reaches the fully-charged state, with no limitations on the charging method and the full charge determination method.

The embodiments of the present invention are described above, but the above-mentioned embodiments only describe a part of examples to which the present invention is applied. The above description is not intended to limit the technical scope of the present invention to the specific configuration of the above-mentioned embodiments.

This application claims priority from Japanese Patent Application No. 2012-56291, filed on Mar. 13, 2012 in the Japan Patent Office, the entire disclosure of which is incorporated herein by reference.

The invention claimed is:

1. A charging device for a storage battery, the charging device comprising:
   a charging power source that is capable of outputting electric power for charging a storage battery;
   a charging electric power detecting device configured to detect electric power charged from the charging power source to the storage battery;
   a temperature detecting device configured to detect a temperature of the storage battery; and
   a controller programmed to:
   determine that the storage battery is fully charged when chargeable electric power calculated based on a detected value of the charging electric power detecting device drops to a prescribed electric power value set in advance or less;
   conduct charging control, in which electric power is supplied to the storage battery from the charging power source until it is determined that the storage battery is fully charged, electric power supply to the storage battery from the charging power source is stopped when it is determined that the storage battery is fully charged, electric power supply is restarted after a prescribed time period elapses from the stop of electric power supply, and electric power supply is continued until it is determined that the storage battery is fully charged again, the lapse of the prescribed time period enabling elimination of at least a part of polarization in the storage battery; and
   set, based on at least the temperature of the storage battery detected by the temperature detecting device when it is determined that the storage battery is fully charged, a stop time that is the prescribed time period from the stop to the restart of electric power supply,
   wherein the controller sets the stop time to be longer as the detected temperature of the storage battery detected by the temperature detecting device becomes lower.

2. The charging device for a storage battery according to claim 1, wherein the controller repeats the charging control a prescribed number of times set in advance.

3. The charging device for a storage battery according to claim 1, wherein the controller is further programmed to correct the set stop time to be shorter as a number of times it is determined that the storage battery is fully charged becomes higher.

4. The charging device for a storage battery according to claim 3, wherein, after the number of times it is determined that the storage battery is fully charged reaches a prescribed number of times, the controller maintains the stop time that is set at a time point when the number of times it is determined that the storage battery is fully charged reaches the prescribed number of times.

5. A method of charging a storage battery, comprising:
  detecting electric power charged to a storage battery from a charging power source that is capable of outputting electric power for charging the storage battery;
  determining, by a controller, that the storage battery is fully charged when chargeable electric power calculated based on a value of the detected electric power drops to a prescribed electric power value set in advance or less;
  conducting, by the controller, charging control, in which electric power is supplied to the storage battery from the charging power source until it is determined that the storage battery is fully charged, electric power supply to the storage battery from the charging power source is stopped when it is determined that the storage battery is fully charged, electric power supply is restarted after a prescribed time period elapses from the stop of electric power supply, and electric power supply is continued until it is determined that the storage battery is fully charged again, the lapse of the prescribed time period enabling elimination of at least a part of polarization in the storage battery;
  detecting a temperature of the storage battery; and
  setting by the controller, based on at least the detected temperature of the storage battery when it is determined that the storage battery is fully charged, a stop time to be longer as the detected temperature of the storage battery becomes lower, the stop time being the prescribed time period from the stop to the restart of electric power supply.

6. A charging device for a storage battery, the charging device comprising:
  a charging power source that is capable of outputting electric power for charging a storage battery;
  charging electric power detecting means for detecting electric power charged from the charging power source to the storage battery;
  full charge determining means for determining that the storage battery is fully charged when chargeable electric power calculated based on a detected value of the charging electric power detecting means drops to a prescribed electric power value set in advance or less;
  charging controlling means for conducting charging control, in which electric power is supplied to the storage battery from the charging power source until it is determined that the storage battery is fully charged, electric power supply to the storage battery from the charging power source is stopped when it is determined that the storage battery is fully charged, electric power supply is restarted after a prescribed time period elapses from the stop of electric power supply, and electric power supply is continued until it is determined that the storage battery is fully charged again, the lapse of the prescribed time period enabling elimination of at least a part of polarization in the storage battery;
  temperature detecting means for detecting a temperature of the storage battery; and
  stop time setting means for setting, based on at least the detected temperature of the storage battery detected by the temperature detecting means when it is determined that the storage battery is fully charged, a stop time that is the prescribed time period from the stop to the restart of electric power supply,
  wherein the stop time setting means sets the stop time to be longer as the detected temperature of the storage battery detected by the temperature detecting means becomes lower.

* * * * *